United States Patent [19]
Young

[11] Patent Number: 4,855,871
[45] Date of Patent: Aug. 8, 1989

[54] THIN FILM SEMICONDUCTOR INTERCONNECT MODULE

[75] Inventor: Peter L. Young, Mercer Island, Wash.

[73] Assignee: Optical Materials, Inc., Mercer Island, Wash.

[21] Appl. No.: 296,923

[22] Filed: Jan. 11, 1989

Related U.S. Application Data

[63] Continuation of Ser. No. 22,011, Mar. 5, 1987, abandoned.

[51] Int. Cl.$^4$ ............................................. H05K 1/02
[52] U.S. Cl. ................................ 361/411; 357/2; 357/71; 361/414; 361/416; 427/96; 427/99; 428/901
[58] Field of Search ............... 361/402, 411, 416, 414; 427/96, 99; 428/336, 354, 901; 357/71, 2

[56] References Cited

U.S. PATENT DOCUMENTS

| | | | |
|---|---|---|---|
| 3,312,923 | 4/1967 | Eubank | 357/2 |
| 3,461,347 | 8/1969 | Lemelson | 361/402 |
| 3,543,196 | 11/1970 | Berglund | 357/2 |
| 3,967,371 | 7/1976 | Croset et al. | 361/411 X |
| 4,458,297 | 7/1984 | Stopper et al. | 174/68.5 X |
| 4,539,222 | 9/1985 | Anderson et al. | 427/99 X |
| 4,544,989 | 10/1985 | Nakabu et al. | 361/386 X |
| 4,551,575 | 11/1985 | Takahashi et al. | 357/30 X |
| 4,562,513 | 12/1985 | Arnold et al. | 361/414 X |
| 4,597,159 | 7/1986 | Usami et al. | 427/99 X |
| 4,628,149 | 12/1986 | Dohya | 361/402 X |
| 4,665,468 | 5/1987 | Dohya | 361/414 |
| 4,681,795 | 7/1987 | Tuckerman | 428/901 X |
| 4,689,113 | 8/1987 | Balasubramanyam et al. | 357/71 X |
| 4,691,078 | 9/1987 | Nishioka et al. | 174/68.5 |
| 4,693,925 | 9/1987 | Cheung et al. | 429/901 X |
| 4,699,803 | 10/1987 | Araps et al. | 427/96 X |
| 4,704,325 | 11/1987 | Crocker | 428/354 |
| 4,786,523 | 11/1988 | Dohya | 361/402 X |
| 4,795,657 | 1/1989 | Formigoni et al. | 427/6 |

Primary Examiner—R. R. Kucia
Attorney, Agent, or Firm—Mason, Kilehmainen, Rathburn & Wyss

[57] ABSTRACT

A thin film interconnect module utilizes a plurality of electroplated conductors disposed in one or more signal layers and surrounded by a dielectric having substantially the same thickness as the conductors to form a substantially planar layer. A metal/dielectric film is employed electrically to interconnect with various ones of the conductors during the electroplating process. After electroplating, selected ones of the electrical interconnections are broken by heating or irradiating selected ones of the interconnections. A dielectric-like film composed of microscopic non-contacting metal islands is used to link conductors that may subsequently need to be electrically connected, the electrical connection being achieved by melting the islands to form a continuous metal film. Interconnections between different planar layers may be achieved by the use of plated through holes. The process permits high density, high aspect ratio conductors to be fabricated on a multi-layer interconnect module.

14 Claims, 1 Drawing Sheet

U.S. Patent          Aug. 8, 1989          4,855,871
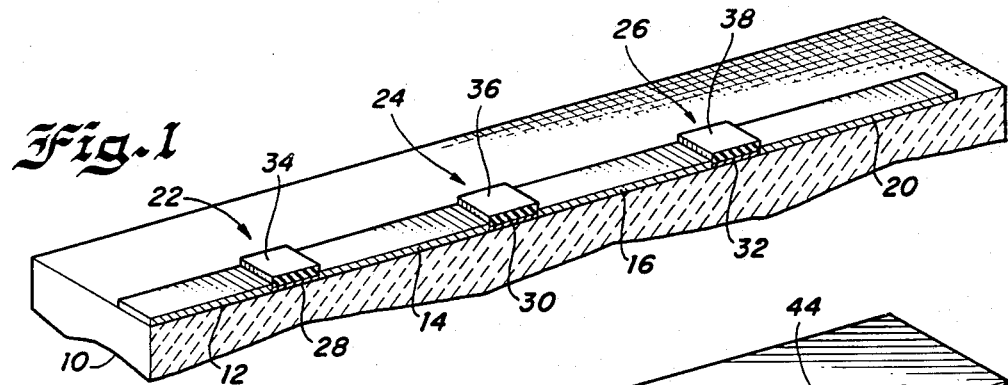
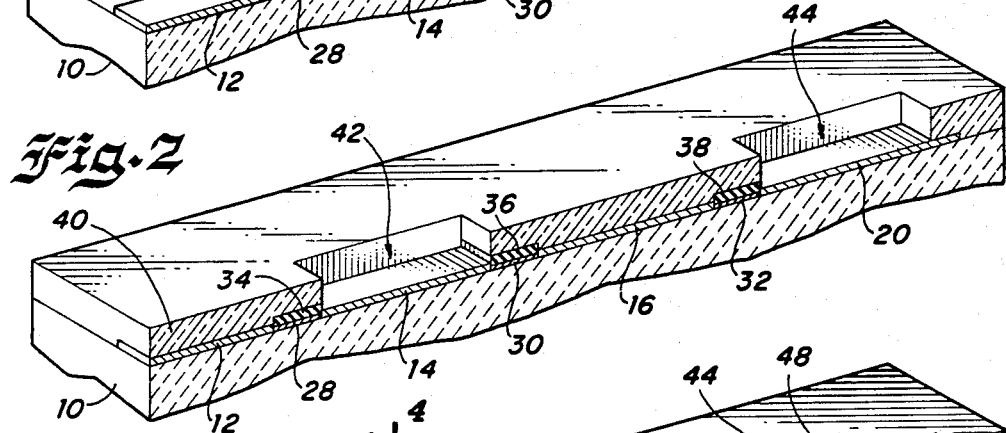
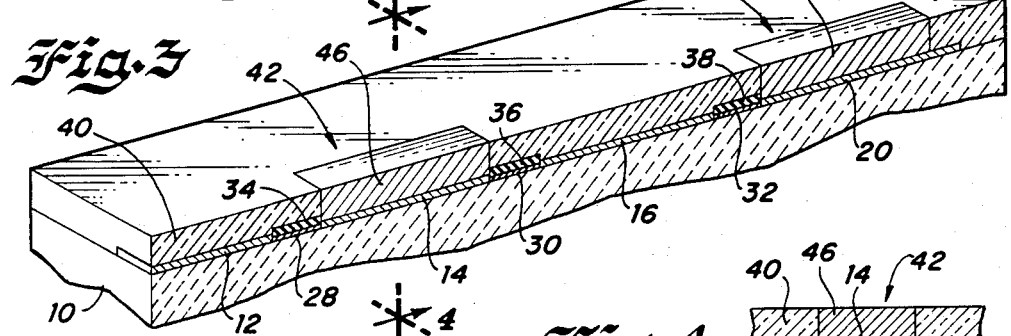
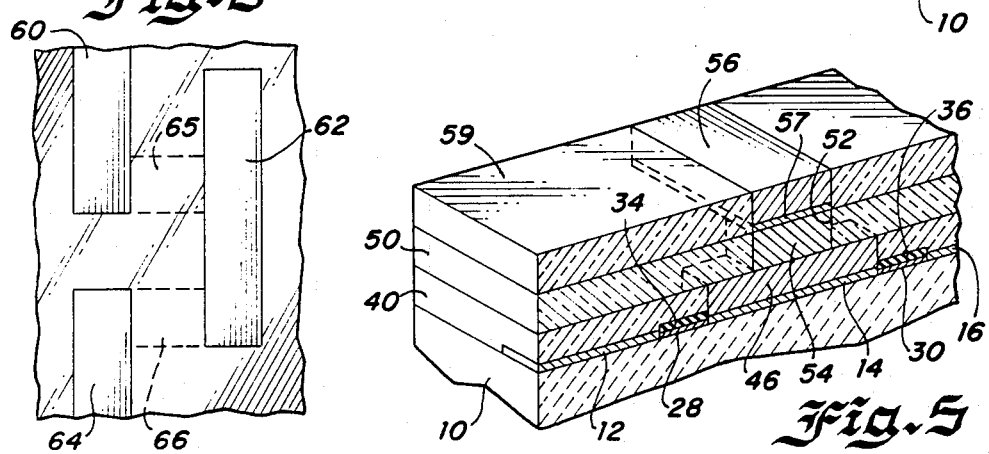

THIN FILM SEMICONDUCTOR INTERCONNECT MODULE

This application is a continuation of application Ser. No. 07/022,011, filed Mar. 5, 1987, now abandoned.

BACKGROUND OF THE INVENTION

1. Field of the Invention

This invention relates generally to semiconductor device fabrication and to an interconnect module having one or more signal planes, each containing a high density of interconnecting signal lines. More particularly, the present invention relates to a method and apparatus for selectively disconnecting and/or connecting predetermined areas on multilayered interconnect modules including areas below the surface of the device.

2. Description of the Prior Art

Although modern semiconductor devices have greatly increased in speed, the increased speed of computer systems has been limited by the signal propagation delay between the semiconductor devices. The cycle time in a computer system is proportional to approximately equal contributions from the semiconductor devices and the signal propagation, or package delay. Improvements in semiconductor devices have lowered the cycle times and now attention is directed to reducing the signal propagation delay in order to further increase computer system speeds. Presently, cycle times are approximately 70 nsec., however a 2 to 4 nsec. range is considered attainable.

Present day printed wiring boards may have dimensions of about 20"×20", thus a reduction in dimensions, to approximately 4"×4", would greatly reduce the system's signal propagation delay, and therefore reduce cycle time. Obviously, to reduce the size of the wiring boards, it is necessary to pack the semiconductor devices closer to each other by mounting the semiconductor chips on a multichip interconnect module having a very large density of signal lines.

This has been partially accomplished by using the thin film technology described by C. W. Ho, et al. in *IBM J. Res. Develop.*, 26, 286 (1982). Ho et al. disclosed that, in order to satisfy the electrical requirements of propagation of high speed pulses on thin film transmission lines while preserving the required high wiring density, it is necessary to build signal lines with high aspect ratios, i.e., a large line thickness to line width ratio. For example, the width of the signal line may be 8-microns wide and the height may be 6 to 8 microns high, yielding an aspect ratio of 0.75 to 1.0. However, as pointed out by Ho et al., it is extremely difficult to build high density thin film signal lines having an aspect ratio approaching or greater than 1.0.

Subsequently, Jensen et al. in *IEEE Transactions on Components Hybrids and Manufacturing Technology*, Vol. CHMT-7, 384 (1984) demonstrated that it is possible to achieve an acceptable degree of planarization and build a two-layer thin film module by first depositing the metal signal layer, then applying very thick dielectric polyimide films. Because thin coats of polyimide films do not produce the necessary planarity, a thick polyimide film is required. Furthermore, the wiring density is relatively low, approximately 80 lines/cm/signal layer. Other disadvantages of the Jensen et al. approach include a potential of impedance control due to variation in the polyimide thickness, difficulty in interconnecting signal wires, or adjacent signal layers and the need for several additional manufacturing steps. More recently, researchers have shown that, by using electroplating techniques, it is possible to build lines with a wiring density of 400 lines/cm/signal layer.

In a typical electroplating technique, a thin plating base, consisting of a patterned metal film is first deposited onto the substrate. Subsequently, a several micron thick dielectric film is deposited on top of the plating base. By either a photolithographic technique or by a conventional etching technique, the dielectric film over the plating base is selectively removed. The substrate is then placed in a plating bath, and a thick metal film is plated over the plating base to a thickness essentially the same as the thickness of the surrounding dielectric film. Thus, a planar surface is formed. This planar configuration permits the fabrication of a second signal layer on top of the first signal layer without the problem of step coverage that can occur when lines cross devices or other lines below them. Planarization effectively avoids the problems inherent in step coverage.

While the electroplating method has several advantages, it suffers a very serious limitation. The signal lines must be completely interconnected for the electroplating process to proceed. This limitation can be partially overcome by connecting all the signal lines at one or both ends of the substrate and cutting the interconnect area after the manufacture of the thin film module is completed. However, this technique does not permit an isolated signal line away from the edge of the substrate to be formed, thus posing potentially unacceptable constraint in the design of multilayered interconnect modules.

Also, in present semiconductor device fabrication technology, it is often necessary to utilize redundancy in order to improve fabrication yields as device density increases. In such semiconductor chips, redundant devices are fabricated, and if a device or a portion of a chip is nonfunctional, a laser beam is used to cut the conductors on the surface of the semiconductor chip leading to the nonfunctional portion in order to isolate that portion from the properly functioning devices. This technique is called laser ablation and is now commonly used by semiconductor chip manufacturers when manufacturing large scale devices, such as, for example, 256K memory devices; however, the technique is usable only for breaking connections on the surface of a device and cannot be used to break connections below the surface without causing damage to the surrounding area. Neither does it provide for a method to connect two signal wires without an elaborate scheme involving highly toxic metal organic gaseous compounds.

SUMMARY OF THE INVENTION

Accordingly, it is an object of the present invention to overcome many disadvantages of the prior art systems.

It is another object of the present invention to provide a thin film interconnect module containing a very high signal line density.

It is another object of the present invention to provide a thin film interconnect module having virtually planar signal planes.

It is another object of the present invention to provide a thin film interconnect module having one or more isolated signal lines that do not extend to the edge of the substrate.

It is another object of the present invention to provide a thin film interconnect module having signal paths that can be re-routed after the manufacture of the module.

It is another object of the present invention to provide a method for disconnecting electrical connections below the surface of a module as well as on the surface of the module.

It is another object of the present invention to provide a method for making electrical connections below as well as on the surface of a module.

It is another object of the present invention to provide a method for writing conductor lines with well-controlled dimensions.

It is another object of the present invention to provide a way to form conductor lines not only on the surface of a semiconductor device, but also in interior levels of the module.

It is an other object of the present invention to provide a multi-layer interconnect module having a high density of high aspect ratio conductors.

Thus, in accordance with a preferred embodiment of the invention, one or more gaps are formed in a signal conductor of a module that lead to a device that may later have to be disconnected from the circuit. A thin layer of a metal such as silver, for example, 450 Angstroms thick is deposited in the gap interconnecting the two conductors and serves electrically to interconnect the conductors on either side of the gap. An insulating or dielectric film is deposited over the metal film to thereby form a composite metal/insulating film. Alternatively, the metal film may be deposited over the dielectric film. The insulating film has the property that it can absorb the thin metal film when the composite metal/insulating film is activated either photolytically or thermally, for example, by focused beam irradiation or by heating. When the metal film is absorbed into the insulating film, the electrical connection between the conductors is essentially broken. Thus, as long as the composite metal/insulating film is accessible to focused beam irradiation or if the device can be heated in an oven, it will be possible to convert it from a conductor connecting two conductors to an insulator, thus electrically disconnecting the two conductors without any ablative process. Furthermore, the process of disconnecting the two conductors can occur even though the conductors and the composite metal/insulating composite film are below the surface of a semiconductor chip, for example, when there is an oxide layer covering the films. This process is important because it permits portions of a discontinuous pattern of conductors to be temporarily interconnected electrically for the purpose of electroplating and then disconnected after the electroplating has been completed.

Furthermore, in order to achieve the full advantage of the present invention, in addition to the composite metal/insulating film, a non-conductive dielectric-like metal film, formed from spaced microscopic pieces of metal in the form of columns or islands, is deposited in the gaps of the signal conductors or between the signal conductors wherever it is anticipated that an electrical connection may be required. The dielectric-like metal film can be covered by subsequent layers such as silicon dioxide, and subsequent layers of deposition can be processed as usual.

When it is necessary to electrically interconnect two areas of the device, a laser beam is focused on the dielectric-like metal film between the conductor lines to be electrically connected. The laser beam heats the dielectric-like material to beyond its melting point, thereby reforming the dielectric-like film to a normal metal film to provide an electrical connection between the conductors. For long lines or complex geometries the laser beam can trace the necessary path between the areas to be connected. By focusing the laser on the appropriate layer of the semiconductor chip, it is possible to interconnect conductors at various levels within the chip, including conductors below the surface of the chip.

BRIEF DESCRIPTION OF THE DRAWING

These and other objects and advantages of the present will become readily apparent upon consideration of the following detailed description and attached drawing, wherein:

FIGS. 1-3 are sectional drawings showing the steps of fabricating conductors on one plane of the interconnect module of the present invention;

FIG. 4 is a sectional view taken along line 4—4 of FIG. 3;

FIG. 5 is a perspective view, partially in cross-section, of a multiple signal plane interconnect module of the present invention illustrating the interconnections between adjacent planes; and FIG. 6 is a plan view of one layer of the interconnect module according to the invention illustrating how adjacent conductors may be selectively connected utilizing a dielectric-like film.

DETAILED DESCRIPTION OF THE PREFERRED EMBODIMENT

Referring to FIG. 1, there is illustrated in simplified form, one aspect of the multilayer semiconductor interconnect module of the present invention. The interconnect module is comprised of a suitable substrate 10, such as silicon or ceramic of appropriate dimensions, typically several inches in diameter or several inches square. The substrate may contain a set of power planes or ground planes, if desired. A plating base of the desired interconnect pattern is formed by depositing thin metal films, several thousand angstroms thick, on selected areas 12, 14, 16 and 20 of the substrate surface by standard vacuum deposition techniques. The metal film may be a 200 angstrom layer of chromium followed by a 2000 angstrom layer of gold or copper, and may be formed according to the method disclosed in U.S. patent application Ser. No. 807,676, filed Dec. 11, 1985, and which issued as U.S. Pat. No. 4,661,214 on Apr. 28, 1987, hereby incorporated by reference.

As illustrated in FIG. 1, the plating base forming the interconnect pattern signal lines may have one or more gaps that prevent an electrical connection from being made to all of the areas 12, 14, 16 and 20, and consequently prevent those areas from being electroplated. Thus, a second deposition is employed electrically to bridge the gaps in the interconnect lines with a composite film in areas 22, 24 and 26 as described in U.S. Pat. No. 4,661,214. For example, the disconnected areas 12, 14, 16 and 20 of the metal plating base may be connected by areas 28, 30 and 32 of a thin silver film which is in contact with a areas 34, 36 and 28 of a film, for example, a silver halide film, that is capable of absorbing the metal film under suitable conditions, as disclosed in the aforementioned U.S. Pat. No. 4,661,219. Other composite films such as a thin silver film in contact with a germanium selenium film may also be used.

If the lines of the plating base are separated by a large gap, for example, greater than approximately 10 microns, preferably rather than connecting the two metal lines only by a single, long section of composite film, it is more desirable to connect the metal lines with a short length of composite film, approximately a few microns long, followed in series, by a relatively long section of metal film, and a second, short length of composite film. For example, the sections of plating base 12 and 20 may be interconnected by the two areas 24 and 26 of composite film and the section of plating base 16. This arrangement substantially reduces the overall resistance of the reconnected line, because the resistance of the composite film may be substantially higher than the metal plating base.

After the plating base with the appropriate composite film is formed, the substrate is covered with a layer 40 (FIG. 2) of dielectric, typically a few microns thick. By standard photolithographic technique or by wet or dry etching techniques, the dielectric film above the plating base is removed in areas such as areas 42 and 44 that are to be plated; however, the dielectric film above the composite film is not removed nor is it removed above areas of plating base, such as area 16, that form part of an interconnect bridging a long gap.

The substrate, having an exposed plating base, is then immersed in a standard electroplating bath and the thickness of the electroplated material 46 and 48 plating base is increased until a virtually planar metal-dielectric surface is formed (FIGS. 3 and 4). Then by either photolytical dissolution or by thermal dissolution, the composite films connecting the gaps in the signal lines may be selectively changed from a conducting state to an insulating state. Thus, a virtually planar film comprising metal interconnect lines completely surrounded by a dielectric film is formed. The width of the electroplated conductors is on the order of 6 to 10 microns, typically on the order of 8 microns, and the thickness of the conductors and surrounding dielectric is on the order of 6 to 10 microns to give the conductors an aspect ratio of 0.6 to 1.0, typically on the order of 0.75. Typically, the pitch of adjacent conductors is on the order of 25 microns, thus giving a spacing between conductors of 17 microns for 8 micron-wide conductors. Connections between the interconnect lines that were made solely to facilitate electroplating may be electrically disconnected from each other after electroplating is completed while other connections between interconnect lines may be maintained until a need to disconnect them arises.

After the first planar interconnect signal layer is formed, a second, laminar dielectric film 50, for example, a polymide film, may be applied to the top surface of the dielectric film 40 above the first interconnect signal plane. Typically, the thickness of the laminar dielectric film is on the order of 6–10 microns. If desired, bores, termed vias, such as a via 52, formed, for example, above the plated conductor 46 (FIG. 5), may be formed in the second dielectric film 40, and metal posts 54 may be plated into the holes. These metal posts will serve as an electrical connection between the first planar interconnect signal layer and a conductor, such as, for example, an orthogonal conductor 56 (FIG. 5) (which may be plated over another plating base 57 through apertures in another insulating layer 59) on the second and any subsequent planar interconnect signal layers eventually formed o top of the first planar signal layer.

It should be added that metal interconnect lines, such as lines 60, 62 and 64 (FIG. 6), also may be formed by forming areas such as areas 64 and 66 of a dielectric like metal film described in U.S. patent application Ser. No. 799,926, filed Nov. 14, 1985, and which issued as U.S. Pat. No. 4,681,778 on July 21, 1987, herein incorporated by reference. The dielectric-like film described in the above-referenced application is a film composed of a plurality of non-contacting conductive metal islands or columns that is deposited in gaps where a future electrical connection may be required. Because the metal islands are non-contacting, the dielectric-like film is non-conducting. However, if an electrical connection between the conductors is desired, the islands may be melted by a laser, or otherwise, to form a continuous metal conductive film, as described in the above-referenced application. Such electrical connections are potentially important in cases where it is necessary to re-route the interconnect lines after the thin film module has been completed. These situations arise because of possible defects encountered in the manufacturing process. The ability to make electrical connections, especially connections beneath the surface of the module allows change in the design of the module. In other words, interconnect modules can be "customized" to fit a particular application from a generic interconnect module design.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A device for interconnecting semiconductor devices, said device having at least one signal layer, said signal layer being substantially planar and having a plurality of electroplated conductors thereon, said electroplated conductors being linked by a material that is a conductor while the electroplated conductors are being formed and an insulator thereafter wherein the material linking said conductors is a composite film comprising a metal layer and a metal halide layer.

2. A device as recited in claim 1 wherein the pitch of the conductors on each signal layer is on the order of 25 microns.

3. A device as recited in claim 1 further including a plated through connection between conductors of two signal layers.

4. A device as recited in claim 1 wherein predetermined ones of said conductors are linked by a dielectric-like film.

5. A device as recited in claim 1 wherein said device has two parallel signal layers each having a plurality of electroplated conductors thereon, and wherein the conductors on adjacent signal layers are orthogonal to each other.

6. A device as recited in claim 1 wherein said device has two parallel signal layers each having a plurality of electroplated conductors, and each signal layer is essentially planar.

7. A device as recited in claim 1 wherein said metal layer includes silver and said metal halide layer includes a silver halide.

8. A device as recited in claim 1 wherein said metal layer is absorbed by the metal halide to change the composite film from a conductor to an insulator.

9. A device for rerouting electrical connections comprising a substrate having a plurality of conductors disposed thereon, a conductive composite metal/dielectric film comprising a layer of metal and layer of dielectric linking predetermined ones of said conductors and a non-conductive dielectric-like film comprising a plurality of non-contacting metal islands linking predetermined other ones of said conductors, said metal/dielectric film being responsive to energy for causing said dielectric to absorb said metal to render said metal/dielectric film non-conductive and said dielectric-like film being responsive to energy to bring said metal islands into contact to render said dielectric-like film conductive.

10. A device as recited in claim 9 wherein said composite and dielectric films are responsive to laser-applied energy 11. A device as recited in claim 9 wherein said composite and dielectric-like films are responsive to non-ablative energy.

12. A device for interconnecting semiconductor devices having conductors disposed in a plane, with predetermined ones of said conductors being linked by a conductive composite film, said composite film being physically alterable from a conductive to a non-conductive state, said composite film comprising a metal film and a dielectric film disposed adjacent to said metal film and in contact therewith, said composite film being responsive to localized heating in predetermined areas to cause said metal film to be physically absorbed by said dielectric film in said predetermined areas to render said composite film non-conductive in said predetermined areas.

13. A device for interconnecting semiconductor devices having conductors disposed in a plane, with predetermined ones of said conductors being linked by a conductive composite film, and other ones of said conductors being linked by a dielectric-like film, said composite film comprising a metal film and a dielectric film disposed adjacent to said metal film and in contact therewith, said composite film being responsive to localized heating in predetermined areas to cause said metal film to be absorbed by said dielectric film in said predetermined areas to render said composite film non-conductive in said predetermined areas, said composite film and said dielectric-like film each having a physically alterable conductive and a non-conductive state.

14. A planarized substrate having a plurality of conductors disposed thereon, and means for selectively interconnecting predetermined ones of said conductors, said interconnecting means including a non-conductive film formed by a plurality of non-contacting microscopic metal columns or islands deposited on said substrate between the conductors to be interconnected, said film being responsive to localized heating in predetermined areas to cause the metal columns to melt and form a continuous metal film in said predetermined areas to render said film conductive in said predetermined areas to thereby selectively interconnect predetermined ones of said conductors.

* * * * *